United States Patent [19]

Seong

[11] Patent Number: 5,321,852
[45] Date of Patent: Jun. 14, 1994

[54] CIRCUIT AND METHOD FOR CONVERTING A RADIO FREQUENCY SIGNAL INTO A BASEBAND SIGNAL

[75] Inventor: Chang-yeol Seong, Seoul, Rep. of Korea

[73] Assignee: SamSung Electronics Co., Ltd., Suwon, Rep. of Korea

[21] Appl. No.: 764,834

[22] Filed: Sep. 24, 1991

[30] Foreign Application Priority Data

Oct. 23, 1990 [KR] Rep. of Korea ............. 90-16917

[51] Int. Cl.$^5$ ............................................. H04B 1/16
[52] U.S. Cl. ...................... 455/182.1; 455/192.1; 455/196.1; 455/243.1; 455/245.1; 455/260; 455/324
[58] Field of Search .............. 455/180.1, 180.2, 180.3, 455/187.1, 188.1, 188.2, 189.1, 190.1, 191.1, 196.1, 197.1, 198.1, 200.1, 208, 232.1, 242.1, 242.2, 243.1, 245.1, 260, 265, 318, 324; 453/182.1, 182.2, 192.1, 192.2, 313, 316

[56] References Cited

U.S. PATENT DOCUMENTS 4,691,378  9/1987  Kumamoto et al. ............. 455/189.1
4,864,640  9/1989  Roza ................................. 455/265

Primary Examiner—Reinhard J. Eisenzopf
Assistant Examiner—Chi Pham
Attorney, Agent, or Firm—Robert E. Bushnell

[57] ABSTRACT

A device for converting a radio frequency signal directly to a baseband signal includes: a receiving section having a tuner for providing a tuned radio frequency signal and a phase-locked loop for providing a phase-locked signal in response to the tuned radio frequency signal; a frequency oscillating section having a voltage controlled oscillator for providing a specific frequency signal, with a same phase and frequency as the tuned radio frequency signal, in response to the phase-locked signal and a control voltage, and a phase comparator providing the control voltage by comparing the phase of the tuned radio frequency signal and the phase of the specific frequency signal; a baseband section for producing the baseband signal by mixing the tuned radio frequency signal and the specific frequency signal; and a gain control section generating a gain control signal fed back to the baseband section and a delayed gain control signal fed back to the receiving section.

17 Claims, 2 Drawing Sheets

CIRCUIT AND METHOD FOR CONVERTING A RADIO FREQUENCY SIGNAL INTO A BASEBAND SIGNAL

BACKGROUND OF THE INVENTION

The present invention relates to a broadcasting signal receiving apparatus. More particularly, it relates to a broadcasting signal direct-receiving circuit which generates a signal having the same frequency as that of a received radio frequency (RF) signal and then mixes the generated signal with the received RF signal to output a baseband signal.

In a conventional broadcasting signal receiving apparatus such as a television set or video tape recorder, the RF signal received by the apparatus is converted into an intermediate frequency IF signal which is then converted into a baseband signal in a demodulator so as to be provided to other devices in the apparatus.

The conventional broadcasting signal receiving circuit as shown in FIG. 1 is a broadcasting signal receiving circuit of a heterodyne reception system in which an IF is used in converting the received RF signal into a baseband signal. In FIG. 1, an input tuner 10 consisting of a band-pass filter is tuned to a wide bandwidth and receives a wide band RF signal among radio waves which are transmitted, the band-pass filter having its frequency bandwidth determined by the frequency of the signal generated by a phase-locked loop portion (hereinafter referred to as PLL).

The received wide band RF signal is amplified to a specific gain in an RF amplifier 20 according to the control signal AGC supplied from an automatic gain controller (not shown).

Thereafter, the RF signal amplified in the RF amplifier 20 is received as a high frequency signal corresponding to the user's desired channel by an interstage tuner 30 in which a frequency band to be tuned is varied according to the frequency of the signal generated by the PLL 40.

Thereafter, the RF signal output from the interstage tuner 30 is mixed in a mixer 60 with a signal of a specific frequency which is generated by a local oscillator 50 under the control of the PLL 40, so as to be an IF signal. This IF signal is then filtered by a band-pass filter 70, amplified by an IF amplifier 80 and thereafter demodulated by a demodulator 90, to be output as a baseband signal.

However, such a conventional broadcasting signal receiving circuit of a heterodyne reception system has a noise problem such as a phenomenon wherein many pictures overlap each other when the received broadcasting signals are displayed on the screen, due to a mutual interference of an image frequency component signal generated by the noise component included in the RF signal input to the mixer 60 and the IF signal during output or the IF signal from the mixer 60. Also, the conventional receiving circuit requires the demodulator 90 in order to convert the IF signal output from the mixer 60 into a baseband signal, and accordingly circuit construction becomes complicated, resulting in difficulties in making the receiving circuit compact and light.

SUMMARY OF THE INVENTION

It is an object of the present invention to provide a broadcasting signal direct-receiving circuit for minimizing the noise effect and to provide for a more integrated circuit in which a baseband signal is directly produced by generating a signal synchronized to the received RF signal and mixing the synchronized signal with the received RF signal in a mixer.

In order to accomplish the object, there is provided a broadcasting signal direct-receiving circuit according to the present invention comprising:

receiving means having a phase-locked loop which produces a signal of a specific frequency by altering frequencies, first and second tuning portions which are connected with the phase-locked loop and each of which receives a broadcast radio frequency signal of a specific channel according to the signal supplied from the phase-locked loop; and output means having a baseband signal output portion which outputs a baseband signal by receiving the radio frequency signal of a specific channel selected by and output from the receiving means and a specific frequency signal of the same frequency and phase as those of the radio frequency signal, and mixing both the signals, a gain control portion which is connected with the baseband signal output portion and controls an output gain of the receiving means by converting the baseband signal into a gain control signal and supplying the gain control signal to the receiving means, and a frequency oscillating portion which is connected with both of the receiving means and baseband signal output portion, and outputs the specific frequency signal having the same frequency and phase as those of the radio frequency signal received by and output from the receiving means, and then supplies the specific frequency signal to the baseband signal output portion.

BRIEF DESCRIPTION OF THE DRAWINGS

The above object and other advantages will become more apparent by the following detailed description of the preferred embodiment of the present invention with reference to the attached drawings in which.

DETAILED DESCRIPTION OF THE PREFERRED EMBODIMENT

An embodiment of a broadcast signal direct-receiving circuit according to the present invention is described in detail with reference to FIG. 2.

Figure 1:
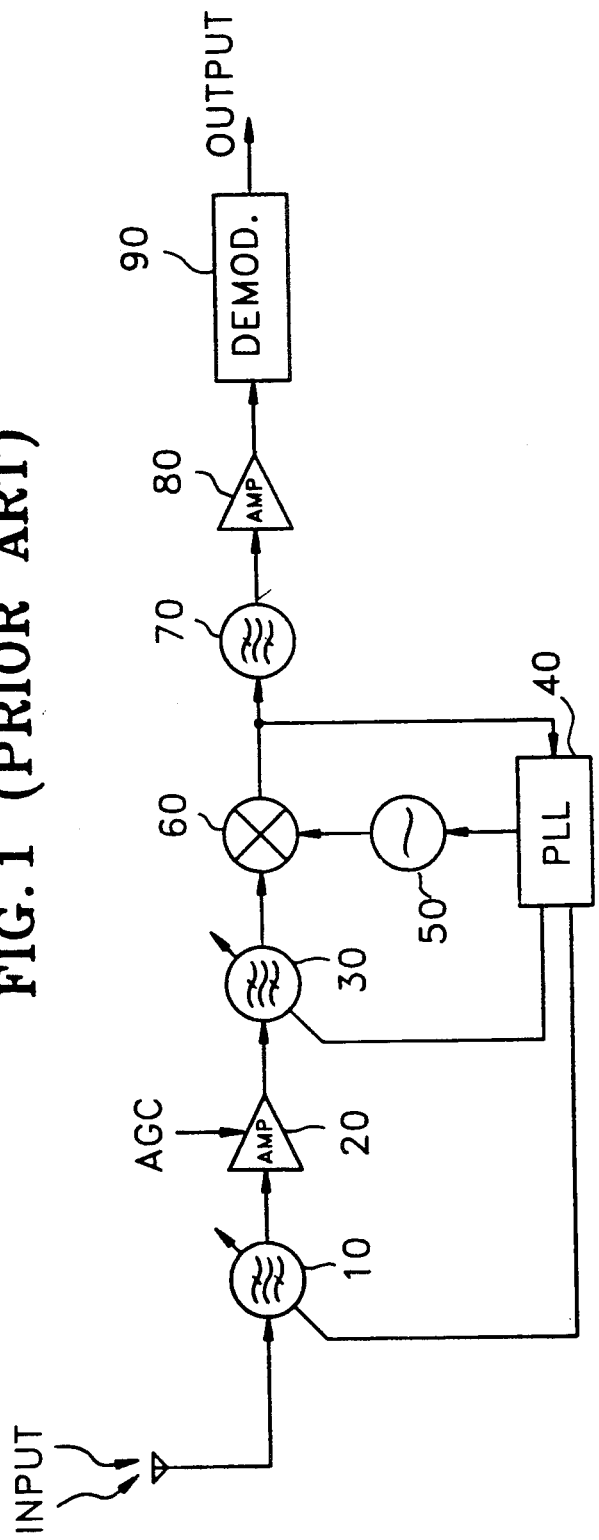
FIG. 1 is a block diagram illustrating a conventional broadcast signal receiving circuit of a heterodyne reception system.
Figure 2:
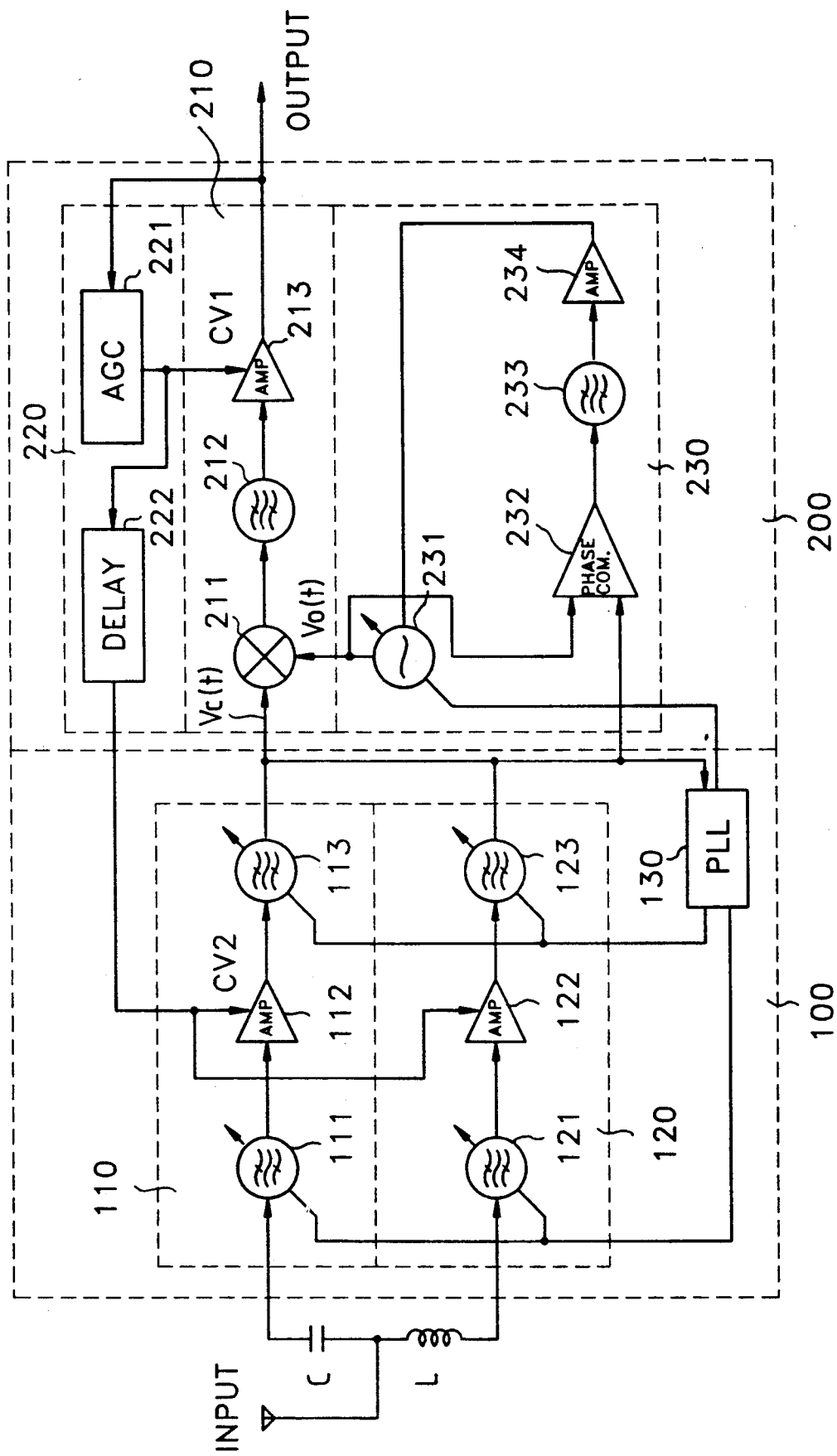
FIG. 2 is a block diagram illustrating a preferred embodiment of a broadcasting signal direct-receiving circuit in accordance with the present invention.

FIG. 2 is a block diagram illustrating an embodiment of a broadcast signal direct-receiving circuit according to the invention which comprises receiving means 100 and output means 200, the receiving means 100 having a PLL 130, a first and second tuning portions 110 and 120, and the output means 200 having a baseband signal output portion 210, a gain control portion 220 and a frequency oscillating portion 230.

In more detail, the receiving means 100 is connected to a resonance circuit comprising a coil L and a capacitor C for receiving RF signals input from the antenna, separating very high frequency (VHF) and ultrahigh frequency (UHF) signals and applying RF signals according to frequency bands. The first tuning portion 110 and the second tuning portion 120 are connected to the PLL 130 for altering the frequency of the output signal of the first tuning portion 110 or the second tuning portion 120 into a specific frequency to provide a phase-locked loop signal.

The first tuning portion 110 comprises a first input tuner 111, a first amplifier 112 which amplifies the RF signal output from the first input tuner 111 according to a gain controlled by the second automatic gain control (AGC) voltage signal CV2, and a first interstage tuner 113 which is connected to the output terminal of the first amplifier 112. The first tuning portion 110 alters the frequency band of the received high frequency signal under the control of the PLL 130 which controls the tuning of the first input tuner 111 and the first interstage tuner 113.

The second tuning portion 120 is constituted in the same manner as the first tuning portion 110 but the frequency band of the RF signal which is tuned in the second tuning portion 120 is different from that of the first tuning portion 110. For instance, the first tuning portion 110 may receive VHF band signals while the second tuning portion 120 receives UHF band signals or vice versa. The baseband signal output portion 210 connected with the receiving means 100 comprises a mixer 211 which mixes the signal having a frequency of a specific broadcasting channel which is output from the frequency oscillating portion 230 according to the specific frequency signal driven and selected by the PLL 130 with the broadcasting RF signal of the specific broadcasting channel output from the receiving means 100, a first low-pass filter 212 which is connected to the output terminal of the mixer 211, and a third amplifier 213 which amplifies the signal output from the first low-pass filter 212 according to the gain controlled by the first AGC voltage signal CV1. The baseband signal output portion 210 converts the RF signal received through the specific broadcasting channel into a baseband signal to output the converted signal.

A gain control portion 220 connected to the baseband signal output portion 210 comprises an automatic gain control circuit (hereinafter referred to as AGC circuit) 221 for detecting the peak baseband signal to supply the AGC voltage signals CV1 and CV2, a delay device 222 for delaying the signal received from the AGC circuit 221 for a certain period. This gain control portion 220 supplies the AGC voltage signals made from the baseband signal to a first, second and third amplifiers 112, 122 and 213, respectively.

A frequency oscillating portion 230 which is connected with the receiving means 100 and the baseband signal output portion 210 includes a voltage controlled oscillator 231 (hereinafter referred to as VCO) for converting the frequency according to the applied voltage thereto and outputting the converted frequency, a phase comparator 232 for comparing the respective phases of the signals supplied from the VCO 231 and the receiving means 100 and outputting a predetermined voltage, a second low-pass filter 233 for removing the high frequency components from the output of phase comparator 232, and a fourth amplifier 234 for amplifying the signal output from the second low-pass filter 233 and applying it to the VCO 231 as a control voltage. This frequency oscillating portion 230 supplies the specific frequency signal having the same frequency as the RF signal received by the receiving means 100 to the mixer 211 of the baseband signal output portion 210.

The broadcasting signal direct-receiving circuit according to this invention as constructed above receives the broadcasting RF signal of the user's desired channel by means of altering the frequency of the phase-locked loop signal supplied from the PLL 130 under the user's control. In more detail, the first and second tuning portions 110 and 120 receive RF signals in the VHF or UHF bands, through the first and second input tuners 111 and 121 respectively, each tuning in a different frequency band according to signals supplied from the PLL 130.

The first input tuner 111 and the second input tuner 121 selectively receive the broadcasting RF signal by selecting the frequency of the signal output from the PLL 130 and thereafter the RF signals having a specific band received by the first and second input tuners 111 and 121 are amplified in the first and second amplifiers 112 and 122, respectively, and in accordance with the gain controlled by the AGC voltage signal CV2 supplied from the gain control portion 220.

Thereafter, of the high frequency signals of specific bandwidths output from the first and second amplifiers 112 and 122, the first and second interstage tuners 113 and 123 track only the frequency band of the user's desired channel, and are tuned to the frequency band of a specific channel according to the frequency of the signal supplied from the PLL 130.

The broadcasting RF signal of a specific channel received through the first or second interstage tuner 113 or 123, is mixed with the specific frequency signal having the frequency of a specific channel supplied from the VCO 231 in the mixer 211 of the baseband signal output portion 210. The output therefrom is the baseband signal component.

At this moment, the VCO 231 oscillates a signal having the frequency tuned according to the phase-locked loop signal supplied from the PLL 130 to supply the result to the mixer 211. The specific frequency signal in the VCO 231 and the RF signal having the frequency of a specific channel output from the first or second interstage tuner 113 or 123 are compared with each other in the phase comparator 232 whose output is in the form of a specific voltage signal corresponding to the phase difference. The high frequency components present in the voltage signal output from the phase comparator 232 are cut off by the second low-pass filter 233 and then the filtered signal is amplified by the fourth amplifier 234 to be applied to the VCO 231.

Consequently, the specific frequency signal output from the VCO 231 is synchronized with the broadcast RF signal of a specific channel output from the receiving means 100 so that the VCO 231 provides a specific frequency signal having the same frequency as that of the RF signal of a specific channel output from the first or second interstage tuner 113 or 123.

In further detail, if the output signal Vc(t) of the first interstage tuner 113 or the second interstage tuner 123 is $$Vc(t) = [Vc + KVm(t)] \cos(Wct + \phi_1)$$

and the output signal Vo(t) of the VCO 231 is $$Vo(t) = \cos(Wct + \phi_2)$$

then, the output signal Vi(t) of the mixer 211 can be represented as $$\begin{aligned} Vi(t) &= Vc(t) \times Vo(t) \\ &= 1/2[Vc + KVm(t)] \{\cos(2Wct + \phi_1 + \phi_2) + \cos(\phi_1 - \phi_2)\} \end{aligned}$$

where,

Vc is a component of the video signal

Vm(t) is a component of the FM-modulated audio signal

K is a predetermined constant

Wc=2πfc (Wc is the angular frequency of the broadcast carrier, and fc is frequency of the broadcast carrier)

$\phi_1$ is the initial phase of the selected TV broadcasting high frequency signal $\phi_2$ is the initial phase of the VCO output signal Thereafter, the 2Wc component in the output of the mixer 211 is cut off when filtered by the first low-pass filter 212, becoming:

$$Vi(t) = \tfrac{1}{2}[Vc + KVm(t)] \cos(\phi_1 - \phi_2)$$

Since the phase difference between phases $\phi_1$ and $\phi_2$, i.e., the phase difference of the two signals input to the mixer 211 is eliminated by the frequency oscillating portion 230, the output signal of the first low-pass filter 212 becomes the baseband signal represented as:

$$Vi(t) = \tfrac{1}{2}[Vc + KVm(t)]$$

The above baseband signal is amplified by the third amplifier 213. The peak value of this amplified baseband signal is detected by the AGC circuit 221 to produce the AGC voltage signal CV1 which is supplied to the third amplifier 213 to control the gain. The first AGC voltage signal CV1 is delayed for a certain period of time in the delay device 222. A delayed AGC voltage signal is a second AGC voltage signal CV2 which is also supplied to the first amplifier 112 or the second amplifier 122 in the receiving means 100, also to control gain.

To wit, the phase of the RF signal from the receiving means 100 and the phase of the specific frequency signal from the VCO 231 are compared with each other in the phase comparator 232, so that VCO 231 is controlled to oscillate the specific frequency signal having the same phase as the RF signal supplied from the receiving means 100. Thereafter both signals from the receiving means 100 and from the VCO 231 are mixed in the mixer 211 to output the baseband signal component.

As described above, the broadcasting signal direct receiving circuit according to the present invention directly produces a baseband signal by generating in the VCO, a specific frequency signal having the same phase as that of the received RF signal as described above in detail, then mixing the two signals, thereby eliminating image frequency problems caused by the prior art wherein a received RF signal has to be converted into an IF signal, and thereafter converted again into a baseband signal. Further, this invention does not require a separate demodulator, thereby enabling the circuit's construction to be compact and light.

What is claimed is:

1. A circuit for converting a radio frequency signal into a baseband signal, said circuit comprising:

receiving means for providing a tuned frequency signal by tuning the radio frequency signal in dependence upon a first phase-locked signal, a second phase-locked signal and a delayed gain control signal, said receiving means comprising a tuning portion and a phase-locked loop providing the first phase-locked signal, the second phase-locked signal and a third phase-locked signal in response to the tuned frequency signal; and output means comprising:

a baseband signal portion generating the baseband signal by mixing the tuned frequency signal and a specific frequency signal comprising a same frequency and phase as said tuned frequency signal;

a gain control portion converting said baseband signal into the delayed gain control signal;

and a frequency oscillating portion comprising a voltage controlled oscillator and a phase comparator, said voltage controlled oscillator generating said specific frequency signal in response to the third phase-locked signal and a control voltage, said phase comparator providing the control voltage by comparing the phase of the tuned frequency signal and the phase of the specific frequency signal.

2. The circuit of claim 1, wherein said tuning portion comprises:

an input tuner providing an input tuner signal in response to both the radio frequency signal and the first phase-locked signal;

an amplifier providing an amplified signal by amplifying the input tuner signal in accordance with the delayed gain control signal; and an interstage tuner providing the tuned frequency signal in response to said amplified signal and said second phase-locked signal.

3. The circuit of claim 1, wherein said gain control portion comprises: an automatic gain control circuit and a delay circuit, said automatic gain control circuit providing the gain control signal to said baseband signal portion in response to said baseband signal and said delay circuit providing the delayed gain control signal to the receiving means in response to the gain control signal.

4. The circuit of claim 1, wherein said baseband signal portion comprises:

a mixer providing a mixed signal by mixing the tuned radio frequency signal and the specific frequency signal;

a low-pass filter providing a filtered signal by filtering the mixed signal; and an amplifier providing the baseband signal by amplifying the filtered signal in dependence upon the gain control signal.

5. The circuit of claim 1, wherein said phase comparator further comprises:

means providing a phase compared-signal by comparing the phase of the tuned frequency signal with the phase of the specific frequency signal;

a low-pass filter providing a filtered signal by filtering the phase-compared signal; and an amplifier providing the control voltage by amplifying the filtered signal.

6. A circuit for converting a received radio frequency signal into a baseband signal, said circuit comprising:

means for providing a tuned radio frequency signal by tuning the received radio frequency signal in response to a gain control signal being delayed and fed back from said baseband signal, said means for providing comprising phase-locked loop means for producing a first phase-locked signal in response to the tuned radio frequency signal; and means for generating the baseband signal by mixing the tuned radio frequency signal with a specific frequency signal comprising a same frequency and phase as the tuned radio frequency signal, said means for generating comprising a voltage controlled oscillator and a phase comparator, said voltage controlled oscillator providing the specific frequency signal in response to a control voltage and the first phase-locked signal, said phase comparator producing the control voltage by comparing the phase of the specific frequency signal and the phase of the tuned radio frequency signal.

7. The circuit for converting the radio frequency signal as claimed in claim 6, wherein said means for providing said tuned radio frequency signal further comprises:

input tuning means for providing an input tuner signal by tuning the radio frequency signal in response to a second phase-locked signal from the phase-locked loop means, amplifying means for providing an amplified signal by amplifying said input tuner signal, and interstage tuning means for providing said tuned radio frequency signal by tuning said amplified signal in response to a third phase-locked signal from the phase-locked loop means.

8. The circuit for converting the radio frequency signal as claimed in claim 6, wherein the means for generating the baseband signal further comprises:

baseband producing means for converting the tuned radio frequency signal into a baseband signal, said baseband producing means comprising:
  mixing means for providing a mixed signal by mixing the specific frequency signal with the tuned radio frequency signal;
  first filtering means for providing a first filtered signal by filtering the mixed signal; and
  first amplifying means for producing the baseband signal by amplifying the first filtered signal in response to the gain control signal;
gain control means for providing the gain control signal in response to the baseband signal, said gain control means comprising:
  automatic gain control means for providing the gain control signal in response to the baseband signal; and
  delay means for providing the delayed gain control signal in response to the gain control signal;
frequency oscillating means for providing the specific frequency signal in response to the control voltage and the first phase-locked signal, said frequency oscillating means comprising:
  said voltage controlled oscillator;
  said phase comparator;
  second filtering means for providing a second filtered signal by filtering the phase-compared signal; and
  second amplifying means for providing the control voltage by amplifying the second filtered signal.

9. A circuit for producing a baseband signal from a tuned radio frequency signal, said circuit comprising:

means for providing a specific frequency signal, comprising an identical frequency and an identical phase of the tuned radio frequency signal, in response to a phase-locked signal and a control voltage, said means for providing comprising:
  voltage controlled oscillating means for producing the specific frequency signal in response to the control voltage and the phase-locked signal; and
  phase comparing means for providing the control voltage by comparing the phase of the tuned radio frequency signal with the phase of the specific frequency signal; and means for producing the baseband signal by mixing the specific frequency signal and the tuned radio frequency signal.

10. A broadcast signal receiving apparatus producing a baseband signal having a same phase and frequency as a radio frequency signal, said apparatus comprising:

receiving means for providing a tuned radio frequency signal by tuning the radio frequency signal, said receiving means comprising:
  a tuner comprising a first input terminal for receiving the radio frequency signal, and an output terminal providing the tuned radio frequency signal; and
  a phase-locked loop comprising an input terminal for receiving the tuned radio frequency signal, a first output terminal for providing a first phase-locked signal to the tuner, a second output terminal for providing a second phase-locked signal to the tuner and a third output terminal for providing a third phase-locked signal; and output means for producing the baseband signal, said output means comprising:
  a baseband circuit converting the tuned radio frequency signal into a baseband signal;
  a gain control circuit comprising an input terminal for receiving the baseband signal, a first output terminal for providing a gain control signal to a second input terminal of the baseband circuit, and a second output terminal for providing said gain control signal being delayed to a second input terminal of the tuner; and
  a frequency oscillating circuit comprising a first input terminal for receiving the tuned radio frequency signal, a second input terminal for receiving the third phase-locked signal, and an output terminal for providing the specific frequency signal to a third input terminal of the baseband circuit.

11. A broadcast signal direct-receiving circuit comprising:

receiving means for providing a tuned radio frequency signal by tuning a radio frequency signal, said receiving means comprising:
tuning means for producing said tuned radio frequency signal, said tuning means frequency signal, said receiving means comprising:
  tuning means for producing said tuned radio frequency signal, said tuning means comprising an input tuner with a first input terminal for receiving the radio frequency signal and an output terminal for providing an input tuner signal, a first amplifier with a first input terminal for receiving the input tuner signal and an output terminal for providing a first amplified signal, and an interstage tuner with a first input terminal for receiving the first amplified signal and an output terminal for providing the tuned radio frequency signal; and
  phase-locked loop means comprising an input terminal for receiving the tuned radio frequency signal, a first output terminal for providing a first phase-locked signal to a second input terminal of the input tuner, a second output terminal for providing a second phase-locked signal to a second input terminal of the interstage tuner, and a third output terminal for providing a third phase-locked signal; and output means for producing a baseband signal in response to the tuned radio frequency signal and the third phase-locked signal, said output means comprising:
- a baseband circuit comprising a mixer with a first input terminal for receiving the tuned radio frequency signal and an output terminal for providing a mixed signal, a first filter with an input terminal for receiving the mixed signal and an output terminal for providing a first filtered signal, and a second amplifier having a first input terminal for receiving the first filtered signal and an output terminal for providing the baseband signal;
- a gain control circuit comprising an automatic gain control section and a delay section, said automatic gain control section having an input terminal for receiving the baseband signal and an output terminal for providing an automatic gain control signal to a second input terminal of the second amplifier, said delay section having an input terminal for receiving the automatic gain control signal and an output terminal for providing said automatic gain control signal being delayed to a second input terminal of the first amplifier; and
- a frequency oscillating circuit comprising:
- a voltage controlled oscillator having a first input terminal for receiving the third phase-locked signal, a second input terminal for receiving a control voltage and an output terminal for providing a specific frequency signal to a second input terminal of the mixer;
- a phase comparator having a first input terminal for receiving the specific frequency signal, a second input terminal for receiving the tuned radio frequency signal and an output terminal for providing a phase-compared signal;
- a second filter having an input terminal for receiving the phase-compared signal and an output terminal for providing a second filtered signal; and
- a third amplifier having an input terminal receiving the second filtered signal and an output terminal for providing the control voltage to a second input terminal of the voltage controlled oscillator.

12. A broadcast signal receiving apparatus for producing a baseband signal having a same phase and frequency as a tuned radio frequency signal, said apparatus comprising:
- a phase-locked loop providing a phase-locked signal in dependence upon the tuned radio frequency signal;
- means for producing a specific frequency signal, comprising a same frequency and phase of the tuned radio frequency, in response to the tuned radio frequency signal and said phase-locked signal, said means for producing comprising:
  - voltage controlled oscillating means for providing the specific frequency signal in response to the phase-locked signal and a control voltage; and
  - phase comparing means for providing the control voltage by comparing the phase of the tuned radio frequency signal and the phase of the specific frequency signal; and
- means for producing the baseband signal by mixing the specific frequency signal with the tuned radio frequency signal.

13. A circuit for producing a baseband signal from a tuned radio frequency signal, said circuit comprising:
- a phase-locked loop providing a phase-locked signal in dependence upon the tuned radio frequency signal;
- means for producing a specific frequency signal in response to said phase-locked loop signal and in response to a phase comparison of the tuned radio frequency signal and the specific frequency signal; and
- means for producing the baseband signal by mixing the specific frequency signal with the tuned radio frequency signal.

14. A method of converting a radio frequency signal into a baseband signal, said method comprising the steps of:
- providing a tuned radio frequency signal by tuning the radio frequency signal in accordance with a phase-locked signal of a phase-locked loop;
- generating a specific frequency signal corresponding in phase and frequency to the tuned radio frequency signal, in response to the phase-locked signal and a control voltage, and providing said control voltage by comparing the phase of the tuned radio frequency signal with the phase of the phase-locked signal; and
- producing the baseband signal by mixing the specific frequency signal and the tuned radio frequency signal.

15. The method of claim 14, wherein the tuning step comprises the step of:
- tuning one of a VHF component and an UHF component of the radio frequency signal.

16. A method of producing a baseband signal from a tuned radio frequency signal, said method comprising the steps of:
- generating a phase-locked signal of the tuned radio frequency signal;
- providing a control voltage corresponding to a comparison of a phase of the tuned radio frequency signal and a phase of a specific frequency signal;
- producing the specific frequency signal comprising a same phase and frequency as the tuned radio frequency signal in response to the phase-locked signal and the control voltage; and
- producing the baseband signal by mixing the specific frequency signal with the tuned radio frequency signal.

17. A method of converting a radio frequency signal to a baseband signal, said method comprising the steps of:
- tuning said radio frequency signal in response to a gain control signal being delayed;
- producing a phase-locked signal in response to the tuned radio frequency signal;
- producing a control signal by comparing a phase of a specific frequency signal with a phase of the tuned radio frequency signal;
- producing the specific frequency signal in a voltage controlled oscillator in response to the phase-locked signal and the control signal; and
- producing the baseband signal by mixing the specific frequency signal with the tuned radio frequency signal and controlling a gain of the baseband signal according to the gain control signal.

* * * * *

UNITED STATES PATENT AND TRADEMARK OFFICE
CERTIFICATE OF CORRECTION

PATENT NO. : 5,321,852
DATED : June 14, 1994
INVENTOR(S) : Chang- Yeol Seong

It is certified that error appears in the above-indentified patent and that said Letters Patent is hereby corrected as shown below:

Column 1,

Line 57    After "output" change "or" to --of--;

Column 2,

Line 44    Change "broadcasting" to --broadcast--;

Column 8,

Lines 45-49    Delete these lines completely- the paragraph from "tuning" to "comprisir Signed and Sealed this Twenty-ninth Day of October 1996

Attest:

BRUCE LEHMAN

*Attesting Officer*    *Commissioner of Patents and Trademarks*